United States Patent
Hamada et al.

(12) 
(10) Patent No.: US 6,432,612 B1
(45) Date of Patent: Aug. 13, 2002

(54) ULTRAVIOLET-CURABLE TYPE PHOTO SOLDER RESIST INK

(75) Inventors: Nobuhito Hamada; Koichi Yoshioka, both of Uji; Soichi Hashimoto, Kyotanabe, all of (JP)

(73) Assignee: Goo Chemical Co., Ltd., Kyoto (JP)

( * ) Notice: Subject to any disclaimer, the term of this patent is extended or adjusted under 35 U.S.C. 154(b) by 0 days.

(21) Appl. No.: 09/255,341

(22) Filed: Feb. 23, 1999

(30) Foreign Application Priority Data

Feb. 25, 1998 (JP) ............................................. 10-044035
Oct. 20, 1998 (JP) ............................................. 10-298128

(51) Int. Cl.$^7$ ............................................. G03F 7/038
(52) U.S. Cl. ..................... 430/280.1; 522/99; 522/103
(58) Field of Search .................... 430/280.1; 522/99, 522/103

(56) References Cited

U.S. PATENT DOCUMENTS

| | | | | |
|---|---|---|---|---|
| 3,989,610 | A | * 11/1976 | Tsukada et al. | ........ 204/159.15 |
| 5,009,982 | A | * 4/1991 | Kamayachi et al. | ..... 430/280.1 |
| 5,124,234 | A | * 6/1992 | Wakata et al. | ........... 430/280.1 |
| 5,215,863 | A | * 6/1993 | Nawata et al. | ........... 430/280.1 |

FOREIGN PATENT DOCUMENTS

| | | |
|---|---|---|
| JP | 61-243869 | 10/1986 |
| JP | 2-173747 | 7/1990 |
| JP | 7-72624 | 3/1995 |
| JP | 9-235348 | 9/1997 |
| WO | WO 95/10931 | * 4/1995 |

* cited by examiner

*Primary Examiner*—Cynthia Hamilton
(74) *Attorney, Agent, or Firm*—Rader, Fishman & Grauer, PLLC

(57) ABSTRACT

An ultraviolet-curable type photo solder resist ink comprises the following components (A) to (E). That is, the component (A) is an ultraviolet-curable resin having at least two ethylenically unsaturated groups and a carboxyl group per one molecule thereof. The component (B) is an epoxy compound having at least two epoxy groups per one molecule thereof. The component (C) is at least one selected from a compound having at least one carboxyl group and a polycarboxylic acid anhydride. The component (D) is a photopolymerization initiator. The component (E) is a diluent. This photo solder resist ink shows a good developing property even when a developer having a pH value of about 10 is used, and is excellent in a storage stability of resist, electrical corrosion resistance, electric performance, chemical resistance, plating resistance, heat resistance to solder, adhesion, and pencil hardness.

6 Claims, No Drawings

ULTRAVIOLET-CURABLE TYPE PHOTO SOLDER RESIST INK

BACKGROUND OF THE INVENTION

1. Field of the Invention

The present invention relates to an ultraviolet-curable and thermo-setting type photo solder resist ink which can be developed by a diluted alkali aqueous solution, and particularly the photo solder resist ink which is preferably used to manufacture a printed wiring board having a fine, high-density conductive pattern.

2. Disclosure of the Prior Art

Recently, to manufacture various kinds of printed wiring boards having fine, high-density conductive patterns, excellent resolution and dimensional accuracy have been required for a solder resist formation step. For this purpose, methods using liquid-type photo solder resist inks have been adopted in place of a conventional screen printing method. For example, as disclosed in Japanese Patent Early Publications [KOKAI] No. 61-243869, No.2-173747, No. 7-72624, and No. 9-235348, these photo solder resist inks use an ultraviolet-curable type resin composition which is obtained by adding an unsaturated group or a carboxyl group to a novolac-type epoxy resin or an acrylic copolymer.

In general, the photo solder resist ink using the above-mentioned ultraviolet-curable type resin composition is applied on a printed wiring board, and then required portions thereof are cured by ultraviolet radiation to remove needless portions by developing. A diluted alkali aqueous solution is usually used as a developer. In this case, it is required to use the developer having a pH value of 11 or more. When the pH value of the developer decreases to about 10, a dried ink film after a selective exposing is difficult to be developed. That is, when the alkalinity of the developer lowers, there is a problem that a predrying condition width, in which the developing property can be maintained, i.e., a developing width, becomes narrow. The developing width is also known as a predrying control width or a predrying acceptable range. In addition, there is a resist ink including melamine to prevent a discoloration of copper. However, since melamine acts as an enhancer of a reaction between a carboxyl group of a novolac-type ultraviolet curable resin or an acrylic ultraviolet curable resin and an epoxy group of an epoxy compound, there is a problem that a viscosity of the resist ink increases, so that a storage stability of the resist ink deteriorates.

SUMMARY OF THE INVENTION

In view of the above-mentioned defects, an object of the present invention is to provide an ultraviolet-curable type photo solder resist ink having excellent storage stability, which exhibits a good developing property even when a developer having a pH value of about 10 is used, and is capable of providing electrical corrosion resistance, electric performance, chemical resistance, plating resistance, heat resistance to solder, adhesion, and pencil hardness of resist. That is, the photo solder resist ink of the present invention comprises the following components (A) to (E). The component (A) is an ultraviolet-curable resin having at least two ethylenically unsaturated groups and a carboxyl group per one molecule thereof. The component (B) is an epoxy compound having at least two epoxy groups per one molecule thereof. The component (C) is at least one selected from a compound having at least one carboxyl group and a polycarboxylic acid anhydride. The component (D) is a photopolymerization initiator. The component (E) is a diluent including an organic solvent.

In a preferred embodiment of the present invention, the component (A) is an ultraviolet-curable resin obtained by a reaction of a copolymer, which is obtained by a polymerization between a first ethylenically-unsaturated monomer having an epoxy group and a second ethylenically-unsaturated monomer different from the first ethylenically-unsaturated monomer, with a third ethylenically-unsaturated monomer having a carboxyl group and one of saturated and unsaturated polybasic acid anhydrides. In particular, it is preferred that the first ethylenically-unsaturated monomer includes glycidyl (meth) acrylate.

It is also preferred that the component (C) includes dicarboxylic acid, or dicarboxylic acid anhydride. In this case, there is an advantage that an influence of pH value of the developer to the developing property of the photo solder resist ink is very small. In particular, it is preferred that a content of dicarboxylic acid or dicarboxylic acid anhydride is within a range of 0.01 to 3.0 wt % with respect to a total amount of the components (A) to (E) except for the organic solvent included in the diluent.

These and still other objects and advantages will become apparent from the following detail descriptions of the preferred embodiments and examples of the invention.

DETAIL DESCRIPTION OF THE PREFERRED EMBODIMENTS

First, a component (A) of an ultraviolet-curable type photo solder resist ink of the present invention is explained in detail. The component (A) is an ultraviolet-curable resin having at least two ethylenically unsaturated groups and a carboxyl group per one molecule thereof. The carboxyl group is used to provide a dissolution, dispersion or swelling property against a diluted alkali aqueous solution to the ultraviolet-curable resin (A) before an exposing step. After the exposing step, the dissolution, dispersion or swelling property against the diluted alkali aqueous solution of the ultraviolet-curable resin (A) lower, so that the photo solder resist ink can be developed by the diluted alkali aqueous solution to obtain a desired image. From this viewpoint, it is preferred that an acid value originated from the carboxyl group of the ultraviolet-curable resin (A) is within a range of 25 to 250 mgKOH/g. On the other hand, at least two ethylenically unsaturated groups are required to the ultraviolet curable resin (A) due to the following reason. That is, as described above, the ultraviolet-curable resin (A) must have the dissolution, dispersion or swelling property against the diluted alkali aqueous solution before the exposing step, so that the desired image can be formed by a selective exposure. For this purpose, an increase of molecular weight and a bridge formation by a photopolymerization are utilized in the ultraviolet-curable resin (A). Therefore, the ultraviolet-curable resin (A) must have at least two ethylenically unsaturated groups with photopolymerization capability. For example, as the ultraviolet-curable resin (A), it is possible to use an ultraviolet-curable resin, in which two or more groups having an ethylenically-unsaturated bonding are introduced to molecular terminal(s) or side chain(s) of a back bone polymer.

For example, as the ultraviolet-curable resin (A), it is possible to use one of ultraviolet-curable resins (A1) to (A4) explained below or a combination thereof. The ultraviolet-curable resin (A1) is obtained by a reaction of a compound, which is obtained by a polymerization of an ethylenically-unsaturated monomer (a) having an epoxy group and the other ethylenically-unsaturated monomer (b), with an ethylenically-unsaturated monomer (d) having a carboxyl group and a saturated or unsaturated polybasic acid anhydride (e). The ultraviolet-curable resin (A2) is obtained by reacting an epoxy compound (c) having at least two epoxy groups per one molecule thereof with the ethylenically-unsaturated monomer (d) having a carboxyl group and the saturated or unsaturated polybasic anhydride (e). The ultraviolet-curable resin (A3) is obtained by a reaction of an acid anhydride copolymer (f) with an alcohol (g) having an ethylenically unsaturated group. The ultraviolet-curable resin (A4) is obtained by a reaction of a compound, which is obtained by a polymerization of the ethylenically unsaturated monomer (d) having the carboxyl group and the ethylenically unsaturated monomer (b) having a polymerization capability with the monomer (d), with the ethylenically-unsaturated monomer (a) having the epoxy group.

As the ethylenically-unsaturated monomer (a), for example, it is possible to use an epoxy cyclohexyl derivative of an acrylic acid or methacrylic acid such as glycidyl acrylate, glycidyl methacrylate, (3,4-epoxy cyclohexyl) methyl acrylate, and (3,4-epoxy cyclehexyl) methyl methacrylate, an alicyclic epoxy derivative of an acrylate or mathacrylate, β-methyl glycidyl acrylate, or β-methyl glycidyl methacrylate. These materials may be used either alone or as a mixture thereof. In particular, it is preferred to use glycidyl acrylate, or glycidyl methacrylate.

As the ethylenically unsaturated monomer (b), an ethylenically unsaturated monomer having a copolymerization capability with the ethylenically unsaturated monomer (a) or (d) can be used. The ethylenically-unsaturated monomer (b) is useful to control the photo curability and adjust properties of a cured film of the resist ink. For example, it is possible to use a straight-chained or branch-chained alkyl ester of acrylic acid, methacrylic acid, acrylic acid alicyclic ester or methacrylic acid alicyclic ester (This ester may have an unsaturated bond at a portion in a ring.) such as methyl acrylate, methyl methacrylate, ethyl acrylate, ethyl methacrylate, propyl acrylate, propyl methacrylate, butyl acrylate, butyl methacrylate, isobutyl acrylate, isobutyl methacrylate, t-butyl acrylate, t-butyl methacrylate, 2-ethylhexyl acrylate, 2-ethylhexyl methacrylate, n-octyl acrylate, n-octyl methacrylate, n-decyl acrylate , n-decyl methacrylate, isodecyl acrylate, isodecyl methacrylate, lauryl acrylate, lauryl methacrylate, myristyl acrylate, myristyl methacrylate, cetyl acrylate, cetyl methacrylate, stearyle acrylate, stearyle methacrylate, cyclohexyl acrylate, cyclohexyl methacrylate, isobornyl acrylate, and isobomyl methacrylate, an ethyleneglycol ester-type acrylate or ethyleneglycol ester-type methacrylate such as hydroxy ethyl acrylate, hydroxy ethyl methacrylate, methoxy ethyl acrylate, methoxy ethyl methacrylate, ethoxy ethyl acrylate, ethoxy ethyl methacrylate, diethyleneglycol mono acrylate, diethyleneglycol mono methacrylate, triethyleneglycol mono acrylate, triethyleneglycol mono methacrylate, methoxy diethyleneglycol mono acrylate, and methoxy diethyleneglycol mono methacrylate, a propyleneglycol acrylate or propyleneglycol meth acrylate, a butyleneglycol mono acrylate or butyleneglycol mono methacrylate, a glycerol mono acrylate or glycerol mono methacrylate, or an aromatic acrylate or aromatic methacrylate such as benzyl acrylate and benzyl methacrylate, an acrylamide compound or methacrylamide compound such as acrylamide, methacrylamide, N-methyl acrylamide, N-methyl methacrylamide, N-propyl acrylamide, N-propyl methacrylamide, N-t-butyl acrylamide, N-t-butyl methacrylamide, N-t-octyl acrylamide, N-t-octyl methacrylamide, diacetone acrylamide, and diacetone methacrylamide, a maleimide such as N-phenylmaleimide, N-(2-methylphenyl) maleimide, N-(4-methylphenyl) maleimide, N-(2-chlorophenyl) maleimide, N-(2,6-diethylphenyl) maleimide, N-methylmaleimide, N-ethylmaleimide, N-isopropylmaleimide, N-laurylmaleimide, and N-cyclohexyl maleimide, vinyl pyrrolidone, acrylonitrile, vinyl acetate, styrene, α-methyl styrene, or vinyl ether. These materials may be used either alone or as a mixture thereof. In particular, it is preferred to use the straight-chained or branch-chained alkyl ester of acrylic acid, methacrylic acid, acrylic acid alicyclic ester or methacrylic acid alicyclic ester (This ester may have an unsaturated bond at a portion in a ring.), hydroxyalkyl acrylate, hydroxyalkyl methacrylate, alkoxyalkyl acrylate, or alkoxyalkyl methacrylate. In this case, there are advantages that a film hardness and oiliness of the ultraviolet-curable resin, and a hardness of the cured film of the resist ink can be easily controlled.

As the epoxy compound (c) having at least two epoxy groups per one molecule thereof, for example, it is possible to use a phenol novolac-type epoxy resin, cresol novolac-type epoxy resin, bisphenol A-type epoxy resin, bisphenol A-novolac-type epoxy resin, bisphenol F-type epoxy resin, triglycidyl isocyanurate, YX 4000 (manufactured by Yuka Shell Epoxy Kabushiki Kaisha), sorbitol polyglycidyl ether, N-glycidyl-type epoxy resin, alycyclic-type epoxy resin (e.g., "EHPE-3150" manufactured by Daicel Chemical Industries, Ltd.), polyol polyglycidyl ether compound, glycidyl ester compound, N-glycidyl type epoxy resin, tris (hydroxyphenyl) methane-based polyfunctional epoxy resin (e.g., "EPPN-502H" manufactured by NIPPON KAYAKU Co., LTD. or "TACTIX-742" and "XD-9053" manufactured by DOW CHEMICAL), hydrogenated bisphenol A-type epoxy resin, dicyclopentadiene-phenol-type epoxy resin, or a naphthalene-type epoxy resin. These materials may be used either alone or as a mixture thereof. In particular, it is preferred to use triglycidyl isocyanurate, YX 4000, phenol novolac-type epoxy resin, cresol novolac-type epoxy resin, bisphenol A-type epoxy resin, or bisphenol A-novolac-type epoxy resin.

As the ethylenically-unsaturated monomer (d), for example, it is possible to use acrylic acid, methacrylic acid, crotonic acid, or cinnamic acid. These materials may be used either alone or as a mixture thereof. In particular, it is preferred to use acrylic acid or methacrylic acid. In this case, there is an advantage that the ethylenically-unsaturated group introduced from acrylic acid or methacrylic acid is excellent in photo reactivity.

As the saturated or unsaturated polybasic acid anhydride (e), for example, it is possible to use a dibasic acid anhydride such as succinic anhydride, methyl succinic anhydride, maleic anhydride, citraconic anhydride, glutaric anhydride, itaconic anhydride, phthalic anhydride, tetrahydrophthalic anhydride, methyl tetrahydrophthalic anhydride, methyl nadic acid anhydride, hexahydrophthalic anhydride, and methyl hexahydrophthalic anhydride, or a polybasic acid anhydride such as trimellitic acid anhydride, pyromellitic acid anhydride, benzophenone tetracarboxylic anhydride and methyl cyclohexene tetracarboxylic anhydride. These materials may be used either alone or as a mixture thereof.

In case of preparing the ultraviolet-curable resins (Al), it is preferred that a content of the ethylenically-unsaturated monomer (a) having the epoxy group is within a range of 40 to 95 mol % with respect to a total amount of the monomer components with polymerization property which are used to prepare a copolymer. In this range, a good photo curability is promised, and sufficient sensitivity and resolution are obtained in a pattern forming process. In addition, the heat resistance to solder of the solder resist is improved. In particular, it is preferred that the content of the ethylenically unsaturated monomer (a) is within a range of 50 to 95 mol %. In this range, excellent heat resistance to solder and electrical corrosion resistance of the solder resist are obtained.

In case of preparing the ultraviolet-curable resins (A1), the copolymer obtained by the reaction between the ethylenically-unsaturated monomers (a) and (b) can be formed through a conventional polymerization method such as solution polymerization, emulsion polymerization, and so on. For example, when using the solution polymerization, a polymerization initiator is added to a mixture of the ethylenically unsaturated monomers (a) and (b) in an organic solvent, and then a polymerization under a reflux condition or a heating and agitating under a nitrogen atmosphere is performed for polymerization.

As the organic solvent, for example, it is possible to use a ketone such as methyl ethyl ketone and cyclohexanone, aromatic hydrocarbon such as toluene and xylene, acetic ester such as ethyl acetate, butyl acetate, cellosolve acetate, butyl cellosolve acetate, butyl carbitol acetate and propyleneglycol monomethyl ether acetate, or a dialkylglycol ether. These materials may be used either alone or as a mixture thereof.

As the polymerization initiator for the foregoing polymerization, for example, it is possible to use a hydroperoxide such as di-isopropyl benzene hydroperoxide, cumene hydroperoxide and t-butyl hydroperoxide, dialkyl peroxide such as dicumyl peroxide, 2,5-dimethyl-2,5-di-(t-butyl peroxy)-hexane, 1,3-bis-(t-butyl peroxy isopropyl)-benzene, t-butyl cumyl peroxide, di-t-butyl peroxide, 2,5-dimethyl-2,5-di-(t-butyl peroxy)-hexyne-3, diacyl peroxide such as isobutyryl peroxide, 2,4-dichlorobenzoyl peroxide, lauroyl peroxide, benzoyl peroxide, and acetyl peroxide, ketone peroxide such as methyl ethyl ketone peroxide, methyl isobutyl ketone peroxide, cyclohexanone peroxide, and acetyl acetone peroxide, alkyl per ester such as t-butyl peroxy pivalate, t-butyl peroxy-2-ethyl hexanoate, t-butyl peroxy-3,5,5-trimethyl hexanoate, t-butyl peroxy acetate and t-butyl peroxy benzoate, peroxy dicarbonate such as di-isopropyl peroxy dicarbonate, di-2-ethyl hexyl peroxy dicarbonate and di-sec-butyl peroxy dicarbonate, or an azo-compound such as azobisiso-butylonitrile, 2,2'-azobisisomethyl butyrate, azobiscyanovaleronitrile, 1,1'-azobis(cyclohexene-1-carbonitrile) and 2,2'-azobis{2-methyl-N-(2-hydroxy ethyl)-propionamide. A combination of the above-listed compounds can be used as the polymerization initiator. In addition, a redox initiator may be used as the polymerization initiator.

In case of preparing the ultraviolet-curable resin (A1) or (A2), it is preferred that a content of the ethylenically-unsaturated monomer (d) having the carboxyl group is determined such that the carboxyl group of the monomer (d) is within a range of 0.7 to 1.2 chemical equivalents per one epoxy equivalent with respect to the copolymer of the ultraviolet-curable resin (Al) or the epoxy compound (c) of the ultraviolet-curable resin (A2). When the carboxyl group is less than 0.7 chemical equivalents, epoxy groups excessively remain in the ultraviolet-curable resin, so that a thermo-setting reaction is caused even under a relatively gentle hot-drying condition for predrying. This often results in a decrease of the developing property after the exposure. On the other hand, when the carboxyl group is more than 1.2 chemical equivalents, there is a possibility than an undesired amount of the ethylenically-unsaturated monomer (d) having unreacted carboxyl group remains.

In case of preparing the ultraviolet-curable resin (A1) or (A2), the polybasic acid anhydride (e) is used to give an acid value to the ultraviolet-curable resin, to thereby provide a re-dispersion or re-dissolution property by a diluted alkali aqueous solution to the ultraviolet curable resin. It is preferred that a content of the polybasic acid anhydride is determined such that the acid value of the ultraviolet-curable resin obtained by adding the polybasic acid anhydride thereto is within a range of 25 to 150 mgKOH/g, and more preferably 40 to 100 mgKOH/g. When the acid value is less than 25 mgKOH/g, the developing property is deteriorated. When the acid value is more than 150 mgKOH/g, there are problems of deteriorating the electrical properties, electrical corrosion resistance, and the waterproof property, which are caused by carboxyl groups remaining in the cured resist ink.

In case of preparing the ultraviolet-curable resin (A1) or (A2), the addition reactions of the ethylenically unsaturated monomer (d) and the saturated or unsaturated acid anhydride (e) can be carried out according to a conventional method. For example, the addition reaction of the ethylenically unsaturated monomer (d) can be performed by the use of a thermal polymerization inhibitor such as a hydroquinone and hydroquinone monomethyl ether, and a catalyst such as a tertiary amine, triphenyl stibine or a quaternary ammonium salt. The tertiary amine comprises benzyl dimethyl amine and triethylamine. The quaternary ammonium salt comprises trimethyl benzyl ammonium chloride and methyl triethyl ammonium chloride. The addition reaction may be performed at a temperature of 60 to 150° C., and preferably 80 to 120° C. The addition reaction of the saturated or unsaturated polybasic acid anhydride may be performed under the conditions similar to the above.

As the acid anhydride copolymer (f) used to obtain the ultraviolet curable resin (A3), it is possible to use a copolymer of maleic anhydride and an ethylenically-unsaturated monomer, for example, a copolymer of styrene and maleic anhydride (e.g., "SAM SERIES" manufactured by ATOCHEM, INC.), copolymer of methylvinyl ether and maleic anhydride (e.g., "GANTREZ AN SERIES" manufactured by ISP (INTERNATIONAL SPECIALTY PRODUCTS)), copolymer of (meth) acrylic acid ester and maleic anhydride, copolymer of α-olefin and maleic anhydride, copolymer of maleic anhydride, itaconic acid anhydride and the other unsaturated monomer. These materials may be used either alone or as a mixture thereof. In the present specification, (meth) acrylic acid is a general term for acrylic acid and methacrylic acid. In addition, (meth) acrylate is a general term for acrylate and methacrylate.

As the alcohol (g) having the ethylenically-unsaturated group which is used to react with the acid anhydride copolymer (f), for example, it is possible to use 2-hydroxy ethyl (meth)acrylate, 2-hydroxy propyl (meth)acrylate, pentaerythritol tri(meth)acrylate, pentaerythritol di(meth) acrylate, trimethylolethane di(meth)acrylate, trimethylolpropane di(meth)acrylate, glycerin-1,3-di(meth)acrylate, or trimethylolmethane di(meth)acrylate. A mixture ratio of the alcohol (g) and the acid anhydride copolymer (f) can be optionally selected. For example, a reaction of the acid anhydride copolymer (f) with the alcohol (f) can be performed at a raised temperature in a suitable solvent such as an ether or an aromatic hydrocarbon. In this case, the above-described catalyst and polymerization inhibitor may be used, if necessary.

In case of preparing the ultraviolet-curable resin (A4), a copolymer resulting from the reaction between the ethylenically-unsaturated monomers (b) and (d) can be obtained by a conventional polymerization method. For example, it is preferred to perform a similar method to that used in the preparation of the ultraviolet-curable resin (A1). In a reaction of adding the ethylenically-unsaturated monomer (a) to this copolymer, a conventional method can be used. For example, it is possible to use the method performed for the addition reaction of the ethylenically-unsaturated monomer (d) to the saturated or unsaturated acid anhydride (e) in the preparation of the ultraviolet-curable resin (A1) or (A2). In case of preparing the ultraviolet-curable resin (A4), an amount used of the ethylenically-unsaturated momomer (a) is determined such that a sufficient acid value remains, while carboxyl groups are kept in the prepared ultraviolet-curable resin (A4).

For example, when using at least one of the above-explained ultraviolet-curable resins (A1) to (A4) as the ultraviolet-curable resin (A), it is preferred that a compounding amount of the ultraviolet-curable resin (A) is within a range of 10 to 80 wt % with respect to the total amount of the photo solder resist ink components except for an organic solvent included in a diluent (E) explained later. In this range, it is possible to provide good sensitivity of the photo solder resist ink and excellent properties of the cured resist ink.

A component (B) of the photo solder resist ink of the present invention is an epoxy compound having at least two epoxy groups per one molecule thereof. As the component (B), for example, it is possible to use a phenol novolac-type epoxy resin, cresol novolac-type epoxy resin, bisphenol A-type epoxy resin, bisphenol A-novolac-type epoxy resin, bisphenol F-type epoxy resin, triglycidyl isocyanurate, YX 4000 (manufactured by Yuka Shell Epoxy Kabushiki Kaisha), sorbitol polyglycidyl ether, N-glycidyl-type epoxy resin, alycyclic-type epoxy resin (e.g., "EHPE-3150" manufactured by Daicel Chemical Industries, Ltd.), polyol polyglycidyl ether compound, glycidyl ester compound, tris (hydroxyphenyl) methane-based polyfunctional epoxy resin (e.g., "EPPN-502H" manufactured by NIPPON KAYAKU Co., LTD. or "TACTIX-742" and "XD-9053" manufactured by DOW CHEMICAL), hydrogenated bisphenol A-type epoxy resin, dicyclopentadiene-phenol-type epoxy resin, naphthalene-type epoxy resin or a vinyl polymerized polymer having epoxy group. These materials may be used either alone or as a mixture thereof. In particular, it is preferred to use triglycidyl isocyanurate, YX 4000, phenol novolac-type epoxy resin, cresol novolac-type epoxy resin, bisphenol A-type epoxy resin, or bisphenol A-novolac-type epoxy resin. It is preferred that a compounding amount of the epoxy compound (B) is within a range of 0.1 to 50 wt % with respect to the total amount of the photo solder resist ink components except for the organic solvent included in the diluent (E). When the compounding amount is less than 0.1 wt %, there is a possibility of lowering the solder resistance and plating resistance of the cured resist ink film. When the compounding amount is more than 50 wt %, there is a possibility of lowering the developing property.

A component (C) of the photo solder resist ink of the present invention is at least one of a compound having at least one carboxyl group and a polycarboxylic acid anhydride. As the compound having at least one carboxyl group, it is possible to use a monocarboxylic acid such as formic acid, acetic acid, propionic acid, butyric acid, valeric acid, caproic acid, caprylic acid, capric acid, laurylic acid, myristic acid, palmitic acid, stearic acid, oleic acid, linolic acid, linolenic acid, cyclohexane carboxylic acid, phenylacetic acid, o-toluic acid, m-toluic acid, p-toluic acid, benzoic acid, o-chlorobenzoic acid, m-chlorobenzoic acid, p-chlorobenzoic acid, o-bromobenzoic acid, m-bromobenzoic acid, p-bromobenzoic acid, o-nitrobenzoic acid, m-nitrobenzoic acid, p-nitrobenzoic acid, p-hydroxybenzoic acid, o-methoxybenzoic acid, m-methoxybenzoic acid, p-methoxybenzoic acid, lactic acid, salicylic acid, glycolic acid, or a dicarboxylic acid such as oxalic acid, malonic acid, succinic acid, glutaric acid, adipic acid, sebacic acid, maleic acid, fumaric acid, itaconic acid, phthalic acid, isophthalic acid, terephthalic acid, hexahydrophthalic acid, 3-ethyl hexahydrophthalic acid, 4-ethyl hexahydrophthalic acid, tetrahydrophthalic acid, 4-ethyl tetrahydrophthalic acid, and crotonic acid, or a tricarboxylic acid such as trimellitic acid and citric acid. It is preferred to use the compound having two or more of carboxyl groups from the above-listed compounds. In particular, it is preferred to use dicarboxylic acid because an influence of pH value of the developer to the developing property of the photo solder resist ink is very small.

As the polycarboxylic acid anhydride, it is possible to use a dicarboxylic anhydride such as succinic anhydride, methyl succinic anhydride, maleic anhydride, citraconic anhydride, glutaric anhydride, itaconic anhydride, phthalic anhydride, tetrahydrophthalic anhydride, methyl tetrahydrophthalic anhydride, nadic acid anhydride, methyl nadic acid anhydride, hexahydrophthalic anhydride, and methyl hexahydrophthalic anhydride, or a polybasic acid anhydride such as trimellitic anhydride, pyromellitic monoanhydride, pyromellitic dianhydride, benzophenone tetracarboxylic anhydride, methyl cyclohexene tetracarboxylic anhydride, ethyleneglycol bisanhydrotrimellitate, and glycerol trisanhydrotrimellitate. These materials may be used either alone or as a mixture thereof. In particular, it is preferred to use the dicarboxylic anhydride because an influence of pH value of the developer can be minimized. In addition, it is possible to use an acid anhydride with an acid, which is not an anhydride.

It is preferred that a compounding amount of the component (C) is within a range of 0.01 to 3.0 wt %, and more preferably 0.05 to 2.5 wt % with respect to the total amount of the photo solder resist ink components except for the organic solvent included in the diluent (E). When the compounding amount is less than 0.01 wt %, there is a tendency that defects occur in a developing step which is performed by the use of a developer having a pH value of about 10. On the other hand, when the compounding amount is more than 3 wt %, there is a possibility of deteriorating the electrical properties of the cured resist film. When using both of the compound having at least one carboxyl group and the polycarboxylic acid anhydride, a mixture ratio thereof can be optionally determined.

As a photopolymerization initiator, which is a component (D) of the photo solder resist ink of the present invention, it is possible to use benzoin, an alkyl ether of benzoin such as benzoin methyl ether, benzoin ethyl ether and benzoin isopropyl ether, acetophenone such as acetophenone, 2, 2-dimethoxy-2-phenyl acetophenone, 2, 2-diethoxy-2-phenyl acetophenone, 1,1-dichloroacetophenone and 1-hydroxy cyclohexyl phenylketone, anthraquinone such as 2-methyl anthraquinone and 2-amyl anthraquinone, thioxanthone such as 2,4-dimethyl thioxanthone, 2,4-diethyl thioxanthone, 2-chlorothioxanthone, 2,4-diisopropyl thioxanthone and 1-chloro-4-propoxy thioxanthone, ketal such as acetophenone dimethylketal and benzyl dimethyl ketal, benzophenone or xanthone such as 3,3-dimethyl-4-methoxy benzophenone, 3,3',4,4'-tetra-(t-buthyl peroxyl carbonyl) benzophenone and 4-benzoyl-4'-methyl diphenyl sulfido, nitrogen contained compound such as 2-metyl-1-[4-(mehtylthio) phenyl]-2-morpholino-1-propanone, 2-benzoyl-2-dimethyl amino-1-(4-morpholinophenyl)-butanone-1 and 4,4'-bis-diethyl aminobenzophenone, or 2,4,6-trimethyl benzoyldiphenyl phosphine oxide. These materials may be used either alone or as a mixture thereof. If necessary, the photopolymerization initiator (D) may be used together with a conventional light-polymerization enhancer or sensitizer such as a benzoic acid, and a tertiary amine, e.g., p-dimethyl aminobenzoic acid ethyl ester, p-dimethyl aminobenzoic acid isoamyl ester, and 2-dimethyl aminoethyl benzoate.

By the way, as a sensitizer for a laser exposing method, for example, it is possible to use a coumarin derivative such as 7-diethylamino-4-methylcoumarin, and 4,6-diethyl-7-ethylaminocoumarin, a carbocyanine coloring laser dye, or a xanthene coloring laser dye. If necessary, a visible-light curability or near-infrared curability may be given to the photo solder resist ink of the present invention in addition to the ultraviolet-curability.

It is preferred that a compounding amount of the component (D) is within a range of 0.1 to 30 wt % with respect to the total amount of the photo solder resist ink components except for the organic solvent included in the diluent (E). In this range, it is possible to obtain excellent photo-curability and improved properties of the solder resist. The diluent including an organic solvent, which is a component (E) of the photo solder resist ink of the present invention, may contain a monomer having a photo-polymerization capability. As the photopolymerization monomer, for example, it is possible to use 2-hydroxy ethyl acrylate, 2-hydroxy ethyl methacrylate, 2-hydroxy propyl acrylate, 2-hydroxy propyl methacrylate, N-vinyl pyrrolidone, acryloylmorpholine, methacryloylmorpholine, methoxy tetraethyleneglycol acrylate, methoxy tetraethyleneglycol methacrylate, methoxy polyethyleneglycol acrylate, methoxy polyethyleneglycol methacrylate, polyethyleneglycol diacrylate, polyethyleneglycol dimethacrylate, N,N-dimethyl acrylamide, N,N-dimethyl methacrylamide, N-methylol acrylamide, N-methylol methacrylamide, N,N-dimethyl aminopropyl acrylamide, N,N-dimethyl aminopropyl methacrylamide, N,N-dimethyl aminoethyl acrylate, N,N-dimethyl aminoethyl methacrylate, N,N-dimethyl aminopropyl acrylate, N,N-dimethyl aminopropyl methacrylate, melamine acrylate, melamine methacrylate, diethyleneglycol diacrylate, diethyleneglycol dimethacrylate, triethyleneglycol diacrylate, triethyleneglycol dimethacrylate, propyleneglycol diacrylate, propyleneglycol dimethacrylate, tripropyleneglycol diacrylate, tripropyleneglycol dimethacrylate, phenoxyethyl acrylate, phenoxyethyl methacrylate, tetrahydrofurfuryl acrylate, tetrahydrofurfuryl methacrylate, cyclohexyl acrylate, cyclohexyl methacrylate, trimethylolpropane diacrylate, trimethylolpropane dimethacrylate, trimethylolpropane triacrylate, trimethylolpropane trimethacrylate, pentaerythritol triacrylate, pentaerythritol trimethacrylate, pentaerythritol tetracrylate, pentaerythritol tetramethacrylate, dipentaerythritol pentacrylate, dipentaerythritol pentamethacrylate, dipentaerythritol hexacrylate, dipentaerythritol hexamethacrylate, isobonyl acrylate, isobonyl methacrylate, cyclopentanyl monoacrylate, cyclopentanyl monomethacrylate, cyclopentenyl monoacrylate, cyclopentenyl monomethacrylate, cyclopentanyl diacrylate, cyclopentanyl dimethacrylate, cyclopentenyl diacrylate, cyclopentenyl dimethacrylate, mono-, di-, tri-, or more polyester of polybasic acid and hydroxyalkyl acrylate or hydroxyalkyl methacrylate, or an acrylate monomer or methacrylate monomer such as polyester acrylate, polyester methacrylate, urethane acrylate, and urethane methacrylate. These materials may be used either alone or as a mixture thereof.

As the organic solvent of the diluent (E), for example, it is possible to use an alcohol such as ethanol, propyl alcohol, isopropyl alcohol, butyl alcohol, isobutyl alcohol, 2-butyl alcohol, hexanol, and ethyleneglycol, ketone such as methyl ethyl ketone and cyclohexanone, aromatic hydrocarbon such as toluene and xylene, oil and aromatic mixed solvent such as "SWASOL SERIES" (manufactured by Maruzen Petrochemical Co., Ltd.), "SOLVESSO SERIES" (manufactured by EXXON CHEMICAL COMPANY), cellosolve such as cellosolve and butyl cellosolve, carbitol such as carbitol and butyl carbitol, propyleneglycol alkyl ether such as propyleneglycol methyl ether, polypropyleneglycol alkyl ether such as dipropyleneglycol methyl ether, acetic ester such as ethyl acetate, butyl acetate, cellosolve acetate, butyl cellosolve acetate, butyl carbitol acetate, and propyleneglycol monomethyl ether acetate, or a dialkylglycol ether. These materials may be used either alone or as a mixture thereof.

The foregoing photopolymerization monomer dilutes the ultraviolet-curable resin (A) so that the photo solder resist ink becomes easy to apply, and the acid value is adjusted to give the photopolymerization property. In addition, the organic solvent dissolves and dilutes the ultraviolet-curable resin (A), so that the photo solder resist ink can be applied as a liquid state, and the applied resist ink is dried to obtain a film.

The photopolymerization monomer is not always required as the diluent (E). However, when the photopolymerization monomer is used, it is preferred that a compounding amount of the photopolymerization monomer is 50 wt % or less with respect to the total amount of the photo solder resist ink components except for the organic solvent included in the diluent (E). When the compounding amount is more than 50 wt %, a surface tackiness of the dried resist film excessively increases, so that the contamination of a mask mounted on the resist film at the exposing step easily occurs.

On the other hand, the organic solvent must be used as the diluent (E) of the photo solder resist ink of the present invention. It is preferred that the organic solvent quickly volatilizes at the drying step, and does not remain in the dried resist film. In addition, it is preferred that a compounding amount of the organic solvent of the diluent (D) is 5% or more with respect to the total amount of the photo solder resist ink components. When the compounding amount is less than 5%, a applying operation of the photo solder resist ink often becomes difficult. A suitable compounding amount of the organic solvent changes according to applying method. Therefore, it is necessary to determine the suitable compounding amount of the organic solvent for the selected applying method.

In addition to the above-explained components (A) to (E), the photo solder resist ink of the present invention may comprise a blocked isocyanate such as tolylene di-isocyanate, morpholine di-isocyanate, isophorone di-isocyanate, and hexamethylene diisocyanate, which are blocked by caprolactam, oxime or malonic ester, an amino resin as a thermosetting component, for example, n-butylated melamine resin, isobutylated melamine resin, butylated urea resin, butylated melamine urea co-condensation resin, benzoguanamine co-condensation resin, an ultraviolet-curable epoxy acrylate, or ultraviolet-curable epoxy methacrylate which is obtained by adding acrylic acid or methacrylic acid to an epoxy resin such as bisphenol A-type epoxy resin, phenol novolac-type epoxy resin, cresol novolac-type epoxy resin and alcyclic epoxy resin, or a high molecular compound such as a diallyl phthalate resin, phenoxy resin, melamine resin, urethane resin, and a fluorine contained resin. For example, several parts by weight of these compounds may be added to the photo solder resist ink of the present invention.

In addition, the photo solder resist ink of the present invention can contain a curing agent or curing enhancer of epoxy resin such as a melamine, imidazole, polyamine, guanamine, tertiary amine, quaternary ammonium salt, and a polyphenol, a filler or a coloring agent such as barium sulfate, silicon oxide, talc, clay, and calcium carbonate, a leveling agent such as a fluorine surface active agent, silicone and acrylate copolymer, an adhesive agent such as a silane coupling agent, a thixotropic agent such as AEROSIL, a polymerization inhibitor such as hydroquinone, hydroquinone monomethyl ether, pyrogallol, t-butylcatechol, and phenothiazine, antihalation agent, flame retardant, defoamer, anti-oxidant, high molecular dispersing agent or a surface-active agent for improving the dispersion stability. For example, several parts by weight of these compounds may be added to the photo solder resist ink of the present invention.

To obtain the photo solder resist ink of the present invention, the above-explained components and additional compounds can be mixed by means of a three-roll, ball mill, sand mill, and so on. For example, a first mixture is prepared by mixing a part of the component (E) and the component (B). A second mixture is prepared by mixing the components (A), (D), (C) and the rest of the component (E). The solder resist ink of the present invention is obtained by mixing the first mixture with the second mixture immediately before the use. Various methods of forming a resist pattern on a substrate by the use of the obtained resist ink are available.

As an example, a preferred method of forming a desired pattern of the photo solder resist ink of the present invention on a substrate is explained. After the resist ink is applied to the substrate surface by means of dipping, spraying, spin coating, roll coating, curtain coating, screen printing, and so on, the resist layer formed on the substrate is predried at a temperature of 60 to 120° C. to volatilize the organic solvent therefrom. Next, a negative mask having a pattern is mounted directly or indirectly on the dried resist film, and ultraviolet is radiated to the dried resist film through the mask by using a chemical lamp, low-pressure mercury lamp, intermediate-pressure mercury lamp, high-pressure mercury lamp, extra-high-pressure mercury lamp, xenon lamp, metalhalide lamp, and so on. Then, a developing operation is performed to obtain the pattern of the resist film. In addition, a heat treatment is performed at a temperature of 120 to 180° C. for 30 to 90 minutes to cure the epoxy compound. This heat treatment brings about improved film strength, hardness, and chemical resistance.

As an alkali solution used in the developing operation, for example, it is possible to use an aqueous solution of sodium carbonate, potassium carbonate, ammonium carbonate, sodium hydrogencarbonate, potassium hydrogencarbonate, ammonium hydrogencarbonate, sodium hydroxide, potassium hydroxide, ammonium hydroxide, and lithium hydroxide. Besides the above alkali solutions, it is possible to use an organic amine such as monoethanol amine, diethanol amine, triethanol amine, monoisopropanol amine, di-isopropanol amine, and tri-isopropanol amine. A combination of these compounds can be used in the developing operation. As a solvent for the alkali solution, it is possible to use water, or a mixture of water and an organic solvent having hydrophilicity, e.g., a lower alcohol.

EXAMPLES

The followings are preferred examples of the present invention. However, needless to say, the present invention does not limited to these examples. The units "parts" and "%" used in the examples means "parts by weight" and "wt %", respectively.

Examples 1 to 22

Photo solder resist inks of Examples 1 to 22 were produced according to compounding amounts of components listed in Tables 1 and 2. For a mixing step of the components listed in Tables 1 and 2, a three-roll mixing method was adopted.

[Preparation of a 50% Ultraviolet-curable Resin Solution (i)]

A polymerization of 70 parts of glycidyl methacrylate, 30 parts of methyl methacrylate, 100 parts of carbitol acetate, 0.2 parts of laurylmercaptan, and 3 parts of azobisisobutyronitrile was performed in a four-mouth flask at a temperature of 80° C. for 5 hours under a nitrogen flow, while agitating. As a result, a 50% copolymer solution was obtained. The flask is formed with a thermometer, glass tube for nitrogen substitution, and an agitator, which are attached to a reflux condenser. Next, 0.05 parts of hydroquinone, 37 parts of acrylic acid, and 0.2 parts of dimethylbenzylamine were added to the copolymer solution to obtain a first mixture. After the first mixture was held at 100° C. for 24 hours, 45 parts of tetrahydrophthalic anhydride and 79 parts of carbitol acetate were added to the first mixture to obtain a second mixture. The second mixture was held at 100° C. for 3 hours to obtain the 50% ultraviolet curable resin solution (i) as the component (A1).

[Preparation of a 60% Ultraviolet-curable Resin Solution (ii)]

214 parts of an epoxy compound "EPICLON N-680" (manufactured by DAINIPPON INK AND CHEMICALS INCORPORATED, Epoxy Equivalents: 214) was dissolved in 60 parts of carbitol acetate to obtain a first mixture. The epoxy compound is a cresol novolac-type epoxy resin. Next, 74 parts of acrylic acid, 0.1 parts of hydroquinone, and 0.7 parts of dimethylbenzylamine were added to the first mixture, and then the resultant mixture was held at a temperature of 90 to 100° C. for 24 hours to obtain a second mixture. 95 parts of carbitol acetate was added to the second mixture, and agitated to obtain an epoxy acrylate solution. Continuously, 76 parts of tetrahydrophthalic anhydride, and 87 parts of carbitol acetate were added to the epoxy acrylate solution, and held at 100° C. for 3 hours to obtain the 60% ultraviolet-curable resin solution (ii) as the component (A2).

[Preparation of a 60% Ultraviolet-curable Resin Solution (iii) of Styrene-maleic Acid Copolymer]

150 parts of a styrene-maleic acid copolymer "SMA-1000A" (manufactured by ELF ATOCHEM JAPAN, INC.) was dissolved in 149 parts of carbitol acetate at a raised temperature to obtain a first mixture. Next, 51 parts of 2-hydroxyethyl acrylate, 0.1 parts of hydroquinone, and 1 part of triethylamine were added to the first mixture, while agitating. Then, the resultant mixture was held at a temperature of 100° C. for 12 hours to obtain a second mixture. In addition, 22 parts of n-butanol was added to the second mixture, and then held for 24 hours to obtain the 60% ultraviolet-curable resin solution (iii) as the component (A3).

[Preparation of a 60% Ultraviolet-curable Resin Solution (iv)]

40 parts of acrylic acid, 28 parts of N-phenylmaleimide, and 32 parts of methyl methacrylate were added to 95 parts of carbitol acetate and 3 parts of azobisisobutyronitrile, and the resultant was held in a four-mouth flask at 80° C. under a nitrogen flow to obtain a first mixture. The flask is formed with a thermometer, glass tube for nitrogen substitution, and an agitator, which are attached to a reflux condenser. Next, 43 parts of glycidyl methacrylate, 0.1 parts of hydroquinone, and 0.7 parts of dimethylbenzylamine were added to the first mixture, and the resultant was held at a temperature of 90 to 100° C. for 24 hours by a conventional method. As a result, the 60% ultraviolet-curable resin solution (iv) was obtained as the component (A4).

Comparative Examples 1 to 4

Photo solder resist inks of Comparative Examples 1 to 4 were produced by the three-roll mixing method according to compounding amounts of components listed in Table 2. In these Comparative Examples, a compound having at least one carboxyl group and a polycarboxylic acid anhydride were not used. In other words, as shown in Table 2, the resist inks of Comparative Examples 1 to 4 were produced without using phthalic acid, malonic acid, itaconic acid, phthalic anhydride, tetrahydrophthalic anhydride, maleic anhydride, and succinic anhydride, which belong to the component (C) of the photo solder resist ink of the present invention.

With respect to the photo solder resist inks of Examples 1–22 and Comparative Examples 1–4, various kinds of evaluation tests were performed.

[1] Surface Tackiness

Each of the photo solder resist inks was applied on copper clad laminates by a screen printing to obtain test samples. The clad laminates are a glass epoxy substrate with a copper foil of a thickness of 35 $\mu$m. To volatilize a solvent component from the applied resist ink, the test samples were dried at 80° C. for three different drying times, i.e., 10, 20 and 30 minutes, to obtain three kinds of dried resist ink films having a thickness of about 20 $\mu$m as test pieces. A mask having a desired pattern was directly mounted on each of the dried resist ink films under a reduced pressure, and then 150 mJ/cm$^2$ of ultraviolet was radiated to the respective resist ink film through the mask. After the ultraviolet radiation, the surface tackiness of the dried resist ink film was evaluated by removing the mask from the resist ink film. Results are shown in Tables 3 and 4. In these Tables, the symbol "○" designates that the mask can be readily removed from the dried resist ink film without remaining a sign of the mask on the resist ink film. The symbol "Δ" designates that the mask can be removed from the dried resist ink film, but the sign of the mask remains on the resist ink film. The symbol "X" designates that it is difficult to remove the mask from the resist ink film, and when the mask is forcedly removed from the resist ink film, a considerable damage of the mask occurs.

[2] Developing Width (Predrying Time Acceptable Range)

Each of the photo solder resist inks was applied on copper clad laminates by a screen-printing to obtain test samples. The clad laminates are a glass epoxy substrate with a copper foil of a thickness of 35 $\mu$m. To volatilize a solvent component from the applied resist ink, the test samples are dried at 80° C. for eight different drying times, i.e., 10, 20, 30, 40, 50, 60, 70, and 80 minutes, to obtain eight kinds of dried resist ink films having a thickness of about 20 $\mu$m as test pieces. A mask having a desired pattern was directly mounted on each of the dried resist ink films under a reduced pressure, and then an optimum amount of ultraviolet was radiated to the respective resist ink film through the mask. After the ultraviolet radiation, each of the dried resist ink films was developed by a sodium carbonate aqueous solution having a pH value of 10 or 11. The developing property of the resist ink film was evaluated. Results are shown in Tables 5 and 6. In these Tables, the symbol "○" designates that an unexposed portion of the resist ink film can be readily developed to obtain a sharp patterning of the resist ink film. The symbol "Δ" designates that it takes an extended time period to develop the unexposed portion of the resist ink film, and it is difficult to provide a fine patterning. The symbol "X" designates that the unexposed portion of the resist ink film can not be removed by the alkaline aqueous solution.

[3] Remaining Step Number

Each of the resist inks was applied on copper clad laminates by a screen-printing to obtain test samples. The clad laminates are a glass epoxy substrate with a copper foil of a thickness of 35 $\mu$m. To volatilize a solvent component from the applied resist ink, the test samples were dried at 80° C. for 20 minutes to obtain dried resist ink films having a thickness of about 20 $\mu$m as test pieces. A mask "STEP TABLET PHOTEC" used as an exposure test material (manufactured by Hitachi Chemical Co., Ltd.) was mounted on each of the dried resist ink films under a reduced pressure. 50 mJ/cm$^2$ of ultraviolet was radiated to one of the dried resist ink films through the mask. 150 mJ/cm$^2$ of ultraviolet was radiated to the other one of the dried resist ink films through the mask. Subsequently, each of these resist ink films was developed by a sodium carbonate aqueous solution having a pH value of 10 or 11. After the developing step, the remaining step numbers were counted to evaluate a degree of exposure sensitivity. Results are shown in Tables 5 and 6.

To evaluate properties of printed wiring boards manufactured by using the photo solder resist inks of Examples 1–22 and Comparative Examples 1–4, test pieces were formed according to the following steps (I) to (V).

(I)<Applying Step>

Each of the resist inks was applied on a substrate having a conductor pattern by a screen printing to obtain a resist ink film thereon. The substrate is a copper clad laminate made of a glass epoxy material and a copper foil of a thickness of 35 $\mu$m.

(II)<Predrying Step>

To volatilize a solvent component from the resist ink film, the resist ink film was predried at 80° C. for 20 minutes to obtain a dried ink film having a thickness of about 20 $\mu$m.

(III)<Exposing Step>

A mask was directly mounted on the dried ink film, an optimum light amount of ultraviolet was radiated to the dried ink film through the mask.

(IV)<Developing Step>

An unexposed portion of the resist ink film was selectively removed by a sodium carbonate aqueous solution having a pH value of 10 to form a pattern of the exposed and cured resist ink film on the substrate.

(V)<Post-baking Step>

After the developing step, the patterned resist ink film on the substrate was further cured at 150° C. for 30 minutes to obtain a solder resist as the test piece.

[4] Resolution

The mask used in the exposing step has a plurality of slits formed in concentric circles. A slit width and a width between adjacent slits are 40 $\mu$m. A sharpness of the obtained solder resist pattern was observed to evaluate the resolution. Results are shown in Tables 7 and 8. In these Tables, the symbol "○" designates that a sharp outline of the solder resist pattern can be obtained and no crack or chipping is observed. The symbol "Δ" designates that the solder resist pattern can be obtained, but cracks or chippings partially occur. The symbol "X" designates that the solder resist pattern can not be formed.

[5] Resistance to Molten Solder

A water-soluble flux "LONCO 3355-11" (manufactured by London Chemical Co., Ltd.) was applied on the test pieces. One of the test pieces was dipped once in a molten solder bath at 260° C. for 15 seconds. As to the other one of the test pieces, the dipping step was repeated five times. Subsequently, these test pieces were washed by water. In each of the test pieces, a degree of discoloration-to-white was observed to evaluate the solder resistance. Results are shown in Tables 7 and 8. In these Tables, the symbol "○" designates that the discoloration-to-white is not observed. The symbol "Δ" designates that the discoloration-to-white is partially observed. The symbol "X" designates that the discoloration-to-white is remarkably observed.

In addition, a crosscut test was performed according to JIS (Japan Industrial Standard) D 0202 by the use of a cellophane adhesive tape. Results of this adhesion test are also shown in Tables 7 and 8. In these Tables, the symbol "○" designates that no peeling-off of the solder resist is observed at the crosscut portion. The symbol "Δ" designates that the peeling-off of the solder resist is partially observed at the cross-cut portion. The symbol "X" designates that the peeling-off of the solder resist already occurs before the crosscut test.

[6] Film Hardness of Pencil Lead.

A hardness of the solder resist was measured by using a pencil "Mitsubishi Hi-Uui" (manufactured by MITSUBISHI PENCIL Co., Ltd.) according to JIS K 5400. Results are shown in Tables 7 and 8.

[7] Solvent Resistance

After the test piece was dipped in 2-propanol and 1,1,1-trichloroethane at a room temperature for 1 hour, it was observed to evaluate the solvent resistance. Results are shown in Tables 7 and 8. In these Tables, the symbol "○" designates that no change is observed. The symbol "Δ" designates that a small change is observed. The symbol "X" designates that a peeling-off of the solder resist is observed.

[8] Acid Resistance

After the test piece was dipped in a 10 wt % hydrochloric acid aqueous solution at a room temperature for 1 hour, it was observed to evaluate the acid resistance. Results are shown in Tables 7 and 8. In these Tables, the symbol "○" designates that no change is observed. The symbol "Δ" designates that a small change is observed. The symbol "X" designates that a peeling-off of the solder resist is observed.

[9] Resistance to Gold Plating

After a gold plating was performed on the test piece by using an electroless nickel-plating bath and an electroless gold-plating bath, an adhesion of the resist film to the substrate was evaluated by the use of an adhesion tape. Results are shown in Tables 7 and 8. In these Tables, the symbol "○" designates that no peeling-off of the resist film is observed. The symbol "Δ" designates that the peeling-off of the resist film is partially observed. The symbol "X" designates that the peeling-off of the resist film is remarkably observed.

[10] Electrical Corrosion Resistance

By using the photo solder resist inks of Examples 1 to 22 and Comparative Examples 1 to 4, specimens for evaluating the electrical corrosion resistance were prepared according to substantially same steps as the above-explained steps (I) to (V) except that a spit-type electrode B of IPC B-25 was used in place of the foregoing substrate. A bias voltage of DC 100 V is loaded to the spit-type electrode, and a confirmation as to whether a migration occurs or not after the elapse of 500 hours under conditions of 40° C. and 90% R.H. was done. Results are shown in Tables 7 and 8. In these Tables, the symbol "○" designates that no migration is confirmed. The symbol "Δ" designates that a small amount of migration is confirmed. The symbol "X" designates that a considerable amount of migration occurs.

Another printed wiring boards were produced as test pieces by using the photo solder resist inks of Examples 1–22 and Comparative Examples 1–4. The test pieces were produced according to substantially same steps as the above-explained steps (I) to (V) except that the following predrying step (II') was performed in place of the prydring step (II). That is, after the applying step (I), the resist ink film was predried at 80° C. for 80 minutes to volatilize a solvent component from the resist ink film. As a result, a dried ink film having a thickness of about 20 μm was obtained. With respect to the test pieces produced through these steps including the prydrying step (II'), the above evaluations [4] to [10] were carried out. Results are shown in Tables 9 and 10.

As understood from Tables 5 to 10, each of the photo solder resist inks of Examples 1 to 22 can provide a sufficient developing property even when the pH value of the developer is 10 which is a weak alkalinity, and a wider predrying time acceptable range, as compared with Comparative Examples 1 to 4. By these advantages, it is possible to bring about an improved production rate of the printed wiring boards.

TABLE 1

| Compositon | Example | | | | | | | | | |
|---|---|---|---|---|---|---|---|---|---|---|
| | 1 | 2 | 3 | 4 | 5 | 6 | 7 | 8 | 9 | 10 |
| Ultraviolet curable resin solution (i) | 50 | 50 | 50 | 50 | 50 | 50 | 50 | — | — | — |
| Ultraviolet-curable resin solution (ii) | — | — | — | — | — | — | — | 50 | — | — |
| Ultraviolet-curable resin solution (iii) | — | — | — | — | — | — | — | — | 50 | — |
| Ultraviolet-curable resin solution (iv) | — | — | — | — | — | — | — | — | — | 50 |
| Phthalic acid | 1 | — | — | 1 | 1 | 0.5 | 0.2 | 1 | 1 | 1 |
| Malonic acid | — | 1 | — | — | — | — | — | — | — | — |
| Itaconic acid | — | — | 1 | — | — | — | — | — | — | — |
| Dipentaerythritol hexacrylate | 5 | 5 | 5 | 5 | 5 | 5 | 5 | 5 | 5 | 5 |
| YX-4000 (*1) | — | — | — | — | 10 | — | — | — | — | — |
| TEPIC (*2) | — | — | — | — | — | — | — | 20 | — | — |

TABLE 1-continued

| Compositon | Example | | | | | | | | | |
|---|---|---|---|---|---|---|---|---|---|---|
| | 1 | 2 | 3 | 4 | 5 | 6 | 7 | 8 | 9 | 10 |
| EPICLON N-680 (*3) | 10 | 10 | 10 | 10 | — | 10 | 10 | — | 10 | 10 |
| Irgacure 907 (*4) | 4 | 4 | 4 | 4 | 4 | 4 | 4 | 4 | 4 | 4 |
| 2,4-di-isopropyl thioxanthone | 0.5 | 0.5 | 0.5 | 0.5 | 0.5 | 0.5 | 0.5 | 0.5 | 0.5 | 0.5 |
| Modaflow (*5) | 1 | 1 | 1 | 1 | 1 | 1 | 1 | 1 | 1 | 1 |
| Silica (Average grain Size: 1 $\mu$m) | 10 | 10 | 10 | 10 | 10 | 10 | 10 | 10 | 10 | 10 |
| Barium sulfate | 15 | 15 | 15 | 15 | 15 | 15 | 15 | 15 | 15 | 15 |
| Melamine | 1 | 1 | 1 | 0.2 | 0.2 | 1 | 1 | 1 | 1 | 1 |
| Phthalocyanine green | 0.5 | 0.5 | 0.5 | 0.5 | 0.5 | 0.5 | 0.5 | 0.5 | 0.5 | 0.5 |
| SWASOL 1500 (*6) | 1 | 1 | 1 | 1 | 1 | 1 | 1 | 1 | 1 | 1 |

(*1): An epoxy compound having the epoxy equivalent of 195 manufactured by Yuka Shell Epoxy Kabushiki Kaisha
(*2): An epoxy resin having the epoxy equivalent of 100 manufactured by NISSAN CHEMICAL INDUSTRIES
(*3): A cresol novolac-type epoxy resin having the epoxy equivalent of 214 manufactured by DAINIPPON INK AND CHEMICALS INCORPORATED
(*4): A photopolymerization initiator manufactured by CIBA-GEIGY CORPORATION
(*5): A leveling agent manufactured by MONSANTO COMPANY
(*6): An aromatic solvent manufactured by Maruzen Petrochemical Co., Ltd.

TABLE 2

| Composition | Example | | | | | | | | | | | | Comparative Example | | | |
|---|---|---|---|---|---|---|---|---|---|---|---|---|---|---|---|---|
| | 11 | 12 | 13 | 14 | 15 | 16 | 17 | 18 | 19 | 20 | 21 | 22 | 1 | 2 | 3 | 4 |
| Ultraviolet-curable resin solution (i) | 50 | 50 | 50 | 50 | 50 | 50 | 50 | 50 | — | — | — | 50 | 50 | — | — | — |
| Ultraviolet-curable resin solution (ii) | — | — | — | — | — | — | — | — | 50 | — | — | — | — | 50 | — | — |
| Ultraviolet-curable resin solution (iii) | — | — | — | — | — | — | — | — | — | 50 | — | — | — | — | 50 | — |
| Ultraviolet-curable resin solution (iv) | — | — | — | — | — | — | — | — | — | — | 50 | — | — | — | — | 50 |
| Phthalic anhydride | 1 | — | — | — | 1 | 1 | 0.5 | 0.2 | 1 | 1 | 1 | — | — | — | — | — |
| Tetrahydrophthalic anhydride | — | 1 | — | — | — | — | — | — | — | — | — | — | — | — | — | — |
| Maleic anhydride | — | — | 1 | — | — | — | — | — | — | — | — | — | — | — | — | — |
| Succinic anhydride | — | — | — | 1 | — | — | — | — | — | — | — | 0.5 | — | — | — | — |
| Malonic acid | — | — | — | — | — | — | — | — | — | — | — | 0.5 | — | — | — | — |
| Dipentaerythritol hexacrylate | 5 | 5 | 5 | 5 | 5 | 5 | 5 | 5 | 5 | 5 | 5 | 5 | 5 | 5 | 5 | 5 |
| YX-4000 | — | — | — | — | — | 10 | — | — | — | — | — | — | — | — | — | — |
| TEPIC | — | — | — | — | — | — | — | — | — | 20 | — | — | — | 20 | — | — |
| EPICLON N-680 | 10 | 10 | 10 | 10 | 10 | — | 10 | 10 | — | 10 | 10 | 10 | 10 | — | 10 | 10 |
| Irgacure 907 | 4 | 4 | 4 | 4 | 4 | 4 | 4 | 4 | 4 | 4 | 4 | 4 | 4 | 4 | 4 | 4 |
| 2,4-di-isopropyl thioxanthone | 0.5 | 0.5 | 0.5 | 0.5 | 0.5 | 0.5 | 0.5 | 0.5 | 0.5 | 0.5 | 0.5 | 0.5 | 0.5 | 0.5 | 0.5 | 0.5 |
| Modaflow | 1 | 1 | 1 | 1 | 1 | 1 | 1 | 1 | 1 | 1 | 1 | 1 | 1 | 1 | 1 | 1 |
| Silica (Average grain Size: 1 $\mu$m) | 10 | 10 | 10 | 10 | 10 | 10 | 10 | 10 | 10 | 10 | 10 | 10 | 10 | 10 | 10 | 10 |
| Barium sulfate | 15 | 15 | 15 | 15 | 15 | 15 | 15 | 15 | 15 | 15 | 15 | 15 | 15 | 15 | 15 | 15 |
| Melamine | 1 | 1 | 1 | 1 | 0.2 | 0.2 | 1 | 1 | 1 | 1 | 1 | 1 | 1 | 1 | 1 | 1 |
| Phthalocyanine green | 0.5 | 0.5 | 0.5 | 0.5 | 0.5 | 0.5 | 0.5 | 0.5 | 0.5 | 0.5 | 0.5 | 0.5 | 0.5 | 0.5 | 0.5 | 0.5 |
| SWASOL 1500 | 1 | 1 | 1 | 1 | 1 | 1 | 1 | 1 | 1 | 1 | 1 | 1 | 1 | 1 | 1 | 1 |

TABLE 3

| Surface Tackiness | Example | | | | | | | | | |
|---|---|---|---|---|---|---|---|---|---|---|
| | 1 | 2 | 3 | 4 | 5 | 6 | 7 | 8 | 9 | 10 |
| Drying time: 10 min | ◯ | ◯ | ◯ | ◯ | ◯ | ◯ | ◯ | ◯ | ◯ | ◯ |
| Drying time: 20 min | ◯ | ◯ | ◯ | ◯ | ◯ | ◯ | ◯ | ◯ | ◯ | ◯ |
| Drying time: 30 min | ◯ | ◯ | ◯ | ◯ | ◯ | ◯ | ◯ | ◯ | ◯ | ◯ |

TABLE 4

| Surface Tackiness | Example | | | | | | | | | | | | Comparative Example | | | |
|---|---|---|---|---|---|---|---|---|---|---|---|---|---|---|---|---|
| | 11 | 12 | 13 | 14 | 15 | 16 | 17 | 18 | 19 | 20 | 21 | 22 | 1 | 2 | 3 | 4 |
| Drying time: 10 min | ○ | ○ | ○ | ○ | ○ | ○ | ○ | ○ | ○ | ○ | ○ | ○ | ○ | ○ | ○ | ○ |
| Drying time: 20 min | ○ | ○ | ○ | ○ | ○ | ○ | ○ | ○ | ○ | ○ | ○ | ○ | ○ | ○ | ○ | ○ |
| Drying time: 30 min | ○ | ○ | ○ | ○ | ○ | ○ | ○ | ○ | ○ | ○ | ○ | ○ | ○ | ○ | ○ | ○ |

TABLE 5

| | | Example | | | | | | | | | |
|---|---|---|---|---|---|---|---|---|---|---|---|
| | | 1 | 2 | 3 | 4 | 5 | 6 | 7 | 8 | 9 | 10 |
| Predrying property/ Drying temperature: 80° C., Predrying time acceptable range: (pH 10) | Drying time: 10 min | ○ | ○ | ○ | ○ | ○ | ○ | ○ | ○ | ○ | ○ |
| | Drying time: 20 min | ○ | ○ | ○ | ○ | ○ | ○ | ○ | ○ | ○ | ○ |
| | Drying time: 30 min | ○ | ○ | ○ | ○ | ○ | ○ | ○ | ○ | ○ | ○ |
| | Drying time: 40 min | ○ | ○ | ○ | ○ | ○ | ○ | ○ | ○ | ○ | ○ |
| | Drying time: 50 min | ○ | ○ | ○ | ○ | ○ | ○ | ○ | ○ | ○ | ○ |
| | Drying time: 60 min | ○ | ○ | ○ | ○ | ○ | ○ | ○ | ○ | ○ | ○ |
| | Drying time: 70 min | ○ | ○ | ○ | ○ | ○ | ○ | ○ | ○ | ○ | ○ |
| | Drying time: 80 min | ○ | ○ | ○ | ○ | ○ | ○ | ○ | ○ | ○ | ○ |
| Remaining step number | Exposure amount: 50 mJ/cm$^2$ | 5 | 5 | 5 | 5 | 5 | 5 | 5 | 5 | 5 | 5 |
| | Exposure amount: 150 mJ/cm$^2$ | 8 | 8 | 8 | 8 | 8 | 8 | 8 | 8 | 8 | 8 |
| Predrying property/ Drying temperature: 80° C., Predrying time acceptable range: (pH 11) | Drying time: 10 min | ○ | ○ | ○ | ○ | ○ | ○ | ○ | ○ | ○ | ○ |
| | Drying time: 20 min | ○ | ○ | ○ | ○ | ○ | ○ | ○ | ○ | ○ | ○ |
| | Drying time: 30 min | ○ | | | | | | | | | |
| | Drying time: 40 min | ○ | ○ | ○ | ○ | ○ | ○ | ○ | ○ | ○ | ○ |
| | Drying time: 50 min | ○ | ○ | ○ | ○ | ○ | ○ | ○ | ○ | ○ | ○ |
| | Drying time: 60 min | ○ | ○ | ○ | ○ | ○ | ○ | ○ | ○ | ○ | ○ |
| | Drying time: 70 min | ○ | ○ | ○ | ○ | ○ | ○ | ○ | ○ | ○ | ○ |
| | Drying time: 80 min | ○ | ○ | ○ | ○ | ○ | ○ | ○ | ○ | ○ | ○ |
| Remaining step number | Exposure amount: 50 mJ/cm$^2$ | 4.5 | 4.5 | 4.5 | 4.5 | 4.5 | 4.5 | 4.5 | 4 | 4.5 | 5 |
| | Exposure amount: 150 mJ/cm$^2$ | 7 | 7 | 7 | 7 | 7 | 7 | 7 | 7 | 7 | 7 |

TABLE 6

| | | Example | | | | | | | | | | | | Comparative Example | | | |
|---|---|---|---|---|---|---|---|---|---|---|---|---|---|---|---|---|---|
| | | 11 | 12 | 13 | 14 | 15 | 16 | 17 | 18 | 19 | 20 | 21 | 22 | 1 | 2 | 3 | 4 |
| Predrying property/ Drying temperature: 80° C., Predrying time acceptable range: (pH 10) | Drying time: 10 min | ○ | ○ | ○ | ○ | ○ | ○ | ○ | ○ | ○ | ○ | ○ | ○ | ○ | ○ | ○ | ○ |
| | Drying time: 20 min | ○ | ○ | ○ | ○ | ○ | ○ | ○ | ○ | ○ | ○ | ○ | ○ | ○ | ○ | ○ | ○ |
| | Drying time: 30 min | ○ | ○ | ○ | ○ | ○ | ○ | ○ | ○ | ○ | ○ | ○ | ○ | ○ | ○ | ○ | ○ |
| | Drying time: 40 min | ○ | ○ | ○ | ○ | ○ | ○ | ○ | ○ | ○ | ○ | ○ | ○ | ○ | ○ | ○ | ○ |
| | Drying time: 50 min | ○ | ○ | ○ | ○ | ○ | ○ | ○ | ○ | ○ | ○ | ○ | ○ | Δ | Δ | Δ | Δ |
| | Drying time: 60 min | ○ | ○ | ○ | ○ | ○ | ○ | ○ | ○ | ○ | ○ | ○ | ○ | Δ | Δ | Δ | Δ |
| | Drying time: 70 min | ○ | ○ | ○ | ○ | ○ | ○ | ○ | ○ | ○ | ○ | ○ | ○ | X | X | X | X |
| | Drying time: 80 min | ○ | ○ | ○ | ○ | ○ | ○ | ○ | ○ | ○ | ○ | ○ | ○ | X | X | X | X |
| Remaining step number | Exposure amount: 50 mJ/cm$^2$ | 5 | 5 | 5 | 5 | 5 | 5 | 5 | 5 | 5 | 5 | 5 | 5 | 5 | 5 | 5 | 5 |
| | Exposure amount: 150 mJ/cm$^2$ | 8 | 8 | 8 | 8 | 8 | 8 | 8 | 8 | 8 | 8 | 8 | 8 | 8 | 8 | 8 | 8 |
| Predrying property/ Drying temperature: 80° C., Predrying time acceptable range: (pH 11) | Drying time: 10 min | ○ | ○ | ○ | ○ | ○ | ○ | ○ | ○ | ○ | ○ | ○ | ○ | ○ | ○ | ○ | ○ |
| | Drying time: 20 min | ○ | ○ | ○ | ○ | ○ | ○ | ○ | ○ | ○ | ○ | ○ | ○ | ○ | ○ | ○ | ○ |
| | Drying time: 30 min | ○ | ○ | ○ | ○ | ○ | ○ | ○ | ○ | ○ | ○ | ○ | ○ | ○ | ○ | ○ | ○ |
| | Drying time: 40 min | ○ | ○ | ○ | ○ | ○ | ○ | ○ | ○ | ○ | ○ | ○ | ○ | ○ | ○ | ○ | ○ |
| | Drying time: 50 min | ○ | ○ | ○ | ○ | ○ | ○ | ○ | ○ | ○ | ○ | ○ | ○ | ○ | ○ | ○ | ○ |
| | Drying time: 60 min | ○ | ○ | ○ | ○ | ○ | ○ | ○ | ○ | ○ | ○ | ○ | ○ | ○ | Δ | Δ | Δ |
| | Drying time: 70 min | ○ | ○ | ○ | ○ | ○ | ○ | ○ | ○ | ○ | ○ | ○ | ○ | Δ | Δ | Δ | Δ |
| | Drying time: 80 min | ○ | ○ | ○ | ○ | ○ | ○ | ○ | ○ | ○ | ○ | ○ | ○ | X | X | X | X |
| Remaining step number | Exposure amount: 50 mJ/cm$^2$ | 4.5 | 4.5 | 4.5 | 4.5 | 4.5 | 4.5 | 4.5 | 4.5 | 4 | 4.5 | 5 | 4.5 | 4.5 | 4 | 4.5 | 5 |
| | Exposure amount: 150 mJ/cm$^2$ | 7 | 7 | 7 | 7 | 7 | 7 | 7 | 7 | 7 | 7 | 7 | 7 | 7 | 7 | 7 | 7 |

TABLE 7

| Properties of test piece | Example | | | | | | | | | |
|---|---|---|---|---|---|---|---|---|---|---|
| | 1 | 2 | 3 | 4 | 5 | 6 | 7 | 8 | 9 | 10 |
| Resolution | ○ | ○ | ○ | ○ | ○ | ○ | ○ | ○ | ○ | ○ |
| Hardness by pencil lead | 6H | 6H | 6H | 6H | 6H | 6H | 6H | 6H | 5H | 5H |
| Surface gross | ○ | ○ | ○ | ○ | ○ | ○ | ○ | ○ | ○ | ○ |
| Adhesion | ○ | ○ | ○ | ○ | ○ | ○ | ○ | ○ | ○ | ○ |
| Solder resistance | | | | | | | | | | |
| Soldering (1 time) | | | | | | | | | | |
| Discoloration to white | ○ | ○ | ○ | ○ | ○ | ○ | ○ | ○ | ○ | ○ |
| Adhesion | ○ | ○ | ○ | ○ | ○ | ○ | ○ | ○ | ○ | ○ |
| Soldering (5 times) | | | | | | | | | | |
| Discoloration to white | ○ | ○ | ○ | ○ | ○ | ○ | ○ | ○ | ○ | ○ |
| Adhesion | ○ | ○ | ○ | ○ | ○ | ○ | ○ | ○ | ○ | ○ |
| Solvent resistance | ○ | ○ | ○ | ○ | ○ | ○ | ○ | ○ | ○ | ○ |
| Acid resistance | ○ | ○ | ○ | ○ | ○ | ○ | ○ | ○ | ○ | ○ |
| Resistance to gold plating | ○ | ○ | ○ | ○ | ○ | ○ | ○ | ○ | Δ | Δ |
| Electrical corrosion resistance | ○ | ○ | ○ | ○ | ○ | ○ | ○ | ○ | ○ | ○ |

TABLE 8

| Properties of test piece | Example | | | | | | | | | | | | Comparative Example | | | |
|---|---|---|---|---|---|---|---|---|---|---|---|---|---|---|---|---|
| | 11 | 12 | 13 | 14 | 15 | 16 | 17 | 18 | 19 | 20 | 21 | 22 | 1 | 2 | 3 | 4 |
| Resolution | ○ | ○ | ○ | ○ | ○ | ○ | ○ | ○ | ○ | ○ | ○ | ○ | ○ | ○ | ○ | ○ |
| Hardness by pencil lead | 6H | 6H | 6H | 6H | 6H | 6H | 6H | 6H | 6H | 6H | 5H | 6H | 6H | 6H | 5H | 5H |
| Surface gross | ○ | ○ | ○ | ○ | ○ | ○ | ○ | ○ | ○ | ○ | ○ | ○ | ○ | ○ | ○ | ○ |
| Adhesion | ○ | ○ | ○ | ○ | ○ | ○ | ○ | ○ | ○ | ○ | ○ | ○ | ○ | ○ | ○ | ○ |
| Solder resistance | | | | | | | | | | | | | | | | |
| Soldering (1 time) | | | | | | | | | | | | | | | | |
| Discoloration to white | ○ | ○ | ○ | ○ | ○ | ○ | ○ | ○ | ○ | ○ | ○ | ○ | ○ | ○ | ○ | ○ |
| Adhesion | ○ | ○ | ○ | ○ | ○ | ○ | ○ | ○ | ○ | ○ | ○ | ○ | ○ | ○ | ○ | ○ |
| Soldering (5 times) | | | | | | | | | | | | | | | | |
| Discoloration to white | ○ | ○ | ○ | ○ | ○ | ○ | ○ | ○ | ○ | ○ | ○ | ○ | ○ | ○ | ○ | ○ |
| Adhesion | ○ | ○ | ○ | ○ | ○ | ○ | ○ | ○ | ○ | ○ | ○ | ○ | ○ | ○ | ○ | ○ |
| Solvent resistance | ○ | ○ | ○ | ○ | ○ | ○ | ○ | ○ | ○ | ○ | ○ | ○ | ○ | ○ | ○ | ○ |
| Acid resistance | ○ | ○ | ○ | ○ | ○ | ○ | ○ | ○ | ○ | ○ | ○ | ○ | ○ | ○ | ○ | ○ |
| Resistance to gold plating | ○ | ○ | ○ | ○ | ○ | ○ | ○ | ○ | ○ | Δ | Δ | ○ | ○ | ○ | Δ | Δ |
| Electrical corrosion resistance | ○ | ○ | ○ | ○ | ○ | ○ | ○ | ○ | ○ | ○ | ○ | ○ | ○ | ○ | ○ | ○ |

TABLE 9

| Properties of test piece | Example | | | | | | | | | |
|---|---|---|---|---|---|---|---|---|---|---|
| | 1 | 2 | 3 | 4 | 5 | 6 | 7 | 8 | 9 | 10 |
| Resolution | ○ | ○ | ○ | ○ | ○ | ○ | ○ | ○ | ○ | ○ |
| Hardness by pencil lead | 6H | 6H | 6H | 6H | 6H | 6H | 6H | 6H | 6H | 6H |
| Surface gross | ○ | ○ | ○ | ○ | ○ | ○ | ○ | ○ | ○ | ○ |
| Adhesion | ○ | ○ | ○ | ○ | ○ | ○ | ○ | ○ | ○ | ○ |
| Solder resistance | | | | | | | | | | |
| Soldering (1 time) | | | | | | | | | | |
| Discoloration to white | ○ | ○ | ○ | ○ | ○ | ○ | ○ | ○ | ○ | ○ |
| Adhesion | ○ | ○ | ○ | ○ | ○ | ○ | ○ | ○ | ○ | ○ |
| Soldering (5 times) | | | | | | | | | | |
| Discoloration to white | ○ | ○ | ○ | ○ | ○ | ○ | ○ | ○ | ○ | ○ |
| Adhesion | ○ | ○ | ○ | ○ | ○ | ○ | ○ | ○ | ○ | ○ |
| Solvent resistance | ○ | ○ | ○ | ○ | ○ | ○ | ○ | ○ | ○ | ○ |
| Acid resistance | ○ | ○ | ○ | ○ | ○ | ○ | ○ | ○ | ○ | ○ |
| Resistance to gold plating | ○ | ○ | ○ | ○ | ○ | ○ | ○ | ○ | ○ | ○ |
| Electrical corrosion resistance | ○ | ○ | ○ | ○ | ○ | ○ | ○ | ○ | ○ | ○ |

TABLE 10

| Properties of test piece | Example | | | | | | | | | | | | Comparative Example | | | |
|---|---|---|---|---|---|---|---|---|---|---|---|---|---|---|---|---|
| | 11 | 12 | 13 | 14 | 15 | 16 | 17 | 18 | 19 | 20 | 21 | 22 | 1 | 2 | 3 | 4 |
| Resolution | ○ | ○ | ○ | ○ | ○ | ○ | ○ | ○ | ○ | ○ | ○ | ○ | — | — | — | — |
| Hardness by pencil lead | 6H | 6H | 6H | 6H | 6H | 6H | 6H | 6H | 6H | 6H | 6H | 6H | 6H | 6H | 6H | 6H |
| Surface gross | ○ | ○ | ○ | ○ | ○ | ○ | ○ | ○ | ○ | ○ | ○ | ○ | — | — | — | — |
| Adhesion | ○ | ○ | ○ | ○ | ○ | ○ | ○ | ○ | ○ | ○ | ○ | ○ | — | — | — | — |
| Solder resistance | | | | | | | | | | | | | | | | |
| Soldering (1 time) | | | | | | | | | | | | | | | | |
| Discoloration to white | ○ | ○ | ○ | ○ | ○ | ○ | ○ | ○ | ○ | ○ | ○ | ○ | — | — | — | — |
| Adhesion | ○ | ○ | ○ | ○ | ○ | ○ | ○ | ○ | ○ | ○ | ○ | ○ | — | — | — | — |
| Soldering (5 times) | | | | | | | | | | | | | | | | |
| Discoloration to white | ○ | ○ | ○ | ○ | ○ | ○ | ○ | ○ | ○ | ○ | ○ | ○ | — | — | — | — |
| Adhesion | ○ | ○ | ○ | ○ | ○ | ○ | ○ | ○ | ○ | ○ | ○ | ○ | — | — | — | — |
| Solvent resistance | ○ | ○ | ○ | ○ | ○ | ○ | ○ | ○ | ○ | ○ | ○ | ○ | — | — | — | — |
| Acid resistance | ○ | ○ | ○ | ○ | ○ | ○ | ○ | ○ | ○ | ○ | ○ | ○ | — | — | — | — |
| Resistance to gold plating | ○ | ○ | ○ | ○ | ○ | ○ | ○ | ○ | ○ | ○ | ○ | ○ | — | — | — | — |
| Electrical corrosion resistance | ○ | ○ | ○ | ○ | ○ | ○ | ○ | ○ | ○ | ○ | ○ | ○ | — | — | — | — |

In Table 10, the symbol "—" designates that the evaluation could not be performed because of poor development.

What is claimed is:

1. An ultraviolet-curable solder resist ink comprising:
   as a component (A), an ultraviolet-curable resin having at least two ethylenically unsaturated groups and a carboxyl group per one molecule thereof;
   as a component (B), an epoxy resin having at least two epoxy groups per one molecule thereof;
   as a component (C), one of a monocarboxylic acid selected from the group consisting of formic acid, acetic acid, propionic acid, butyric acid, valeric acid, caproic acid, caprylic acid, capric acid, laurylic acid, myristic acid, palmitic acid, stearic acid, oleic acid, linolic acid, linolenic acid, cyclohexane carboxylic acid, phenylacetic acid, o-toluic acid, m-toluic acid, p-toluic acid, benzoic acid, o-chlorobenzoic acid, m-chlorobenzoic acid, p-chlorobenzoic acid, o-bromobenzoic acid, m-bromobenzoic acid, p-bromobenzoic acid, o-nitrobenzoic acid, m-nitrobenzoic acid, p-nitrobenzoic acid, p-hydroxybenzoic acid, o-methoxybenzoic acid, m-methoxybenzoic acid, p-methoxybenzoic acid, lactic acid, salicylic acid, and glycolic acid, a dicarboxylic acid selected from the group consisting of oxalic acid, malonic acid, succinic acid, glutaric acid, adipic acid, sebacic acid, maleic acid, fumaric acid, itaconic acid, phthalic acid, isophthalic acid, terephthalic acid, hexahydrophthalic acid, 3-ethyl hexahydrophthalic acid, 4-ethyl hexahydrophthalic acid, tetrahydrophthalic acid, 4-ethyl tetrahydrophthalic acid, and crotonic acid, or a tricarboxylic acid selected from the group consisting of trimellitic acid and citric acid; as a component (D), a photo-polymerization initiator; and as a component (E), a diluent including an organic solvent.

2. The photo solder resist ink as set forth in claim 1, wherein said component (A) is an ultraviolet-curable resin obtained by reacting a copolymer, which is obtained by a polymerization between a first ethylenically-unsaturated monomer having an epoxy group and a second ethylenically-unsaturated monomer different from said first ethylenically-unsaturated monomer, with both of (i) a third ethylenically-unsaturated monomer having a carboxyl group and (ii) one of saturated or unsaturated polybasic acid anhydrides.

3. the photo solder resist ink as set forth in claim 2, wherein said first ethylenically-unsaturated monomer includes glycidyl (meth) acrylate.

4. An ultraviolet-curable photo solder resist ink comprising:
   as a component (A), an ultraviolet-curable resin having at least two ethylenically unsaturated groups and a carboxyl group per one molecule thereof;
   as a component (B), an epoxy resin having at least two epoxy groups per one molecule thereof;
   as a component (C), a dicarboxylic acid selected from the group consisting of oxalic acid, malonic acid, succinic acid, glutaric acid, adipic acid, sebacic acid, maleic acid, fumaric acid, itaconic acid, phthalic acid, isophthalic acid, terephthalic acid, hexahydrophthalic acid, 3-ethyl hexahydrophthalic acid, 4-ethyl hexahydrophthalic acid, tetrahydrophthalic acid, 4-ethyl tetrahydrophthalic acid, and crotonic acid;
   as a component (D), a photo-polymerization initiator; and
   as a component (E), a diluent including an organic solvent.

5. The photo solder resist ink as set forth in claim 4, wherein a content of dicarboxylic acid is within a range of 0.01 to 3.0 wt % with respect to a total amount of said components (A) to (E) except for said organic solvent included in said diluent (E).

6. An ultraviolet-curable photo solder resist ink comprising:
- as a component (A), an ultraviolet-curable resin having at least two ethylenically unsaturated groups and a carboxyl group per one molecule thereof;
- as a component (B), an epoxy resin having at least two epoxy groups per one molecule thereof;
- as a component (C), a dicarboxylic acid selected from the group consisting of malonic acid, itaconic acid, and phthalic acid;
- as component (D), a photo-polymerization initiator; and
- as a component (E), a diluent including an organic solvent.

* * * * *